(12) United States Patent
Hoshino et al.

(10) Patent No.: US 8,318,518 B2
(45) Date of Patent: Nov. 27, 2012

(54) LIGHT EMITTING DEVICE AND MANUFACTURING METHOD THEREOF

(75) Inventors: Hitoshi Hoshino, Ota-Ku (JP); Toshiyuki Tateishi, Ota-ku (JP)

(73) Assignee: Disco Corporation, Tokyo (JP)

( * ) Notice: Subject to any disclaimer, the term of this patent is extended or adjusted under 35 U.S.C. 154(b) by 121 days.

(21) Appl. No.: 12/952,489

(22) Filed: Nov. 23, 2010

(65) Prior Publication Data
US 2011/0133235 A1 Jun. 9, 2011

(30) Foreign Application Priority Data
Dec. 9, 2009 (JP) .................................. 2009-279391

(51) Int. Cl.
*H01L 21/00* (2006.01)
(52) U.S. Cl. ...................... 438/31; 257/98; 257/E33.068
(58) Field of Classification Search ................. 438/31; 257/98, E33.068
See application file for complete search history.

(56) References Cited

U.S. PATENT DOCUMENTS

| | | | |
|---|---|---|---|
| 7,754,504 B2 * | 7/2010 | Ohmae et al. | 438/22 |
| 2006/0234407 A1 * | 10/2006 | Kim et al. | 438/22 |
| 2007/0148803 A1 * | 6/2007 | Yakushiji et al. | 438/33 |
| 2011/0204378 A1 * | 8/2011 | Su et al. | 257/76 |

FOREIGN PATENT DOCUMENTS

| | | |
|---|---|---|
| JP | 10-056203 | 2/1998 |
| JP | 10-305420 | 11/1998 |
| JP | 2002-192370 | 7/2002 |

* cited by examiner

*Primary Examiner* — Trung Q Dang
(74) *Attorney, Agent, or Firm* — Greer, Burns & Crain, Ltd.

(57) ABSTRACT

A light emitting device including a sapphire layer and a light emitting layer formed on the sapphire layer. The sapphire layer has a polygonal sectional shape whose internal angle is an obtuse angle, such as a regular hexagonal shape. Light emitted from the light emitting layer is totally reflected on one side surface of the sapphire layer and next transmitted through another side surface of the sapphire layer.

1 Claim, 10 Drawing Sheets

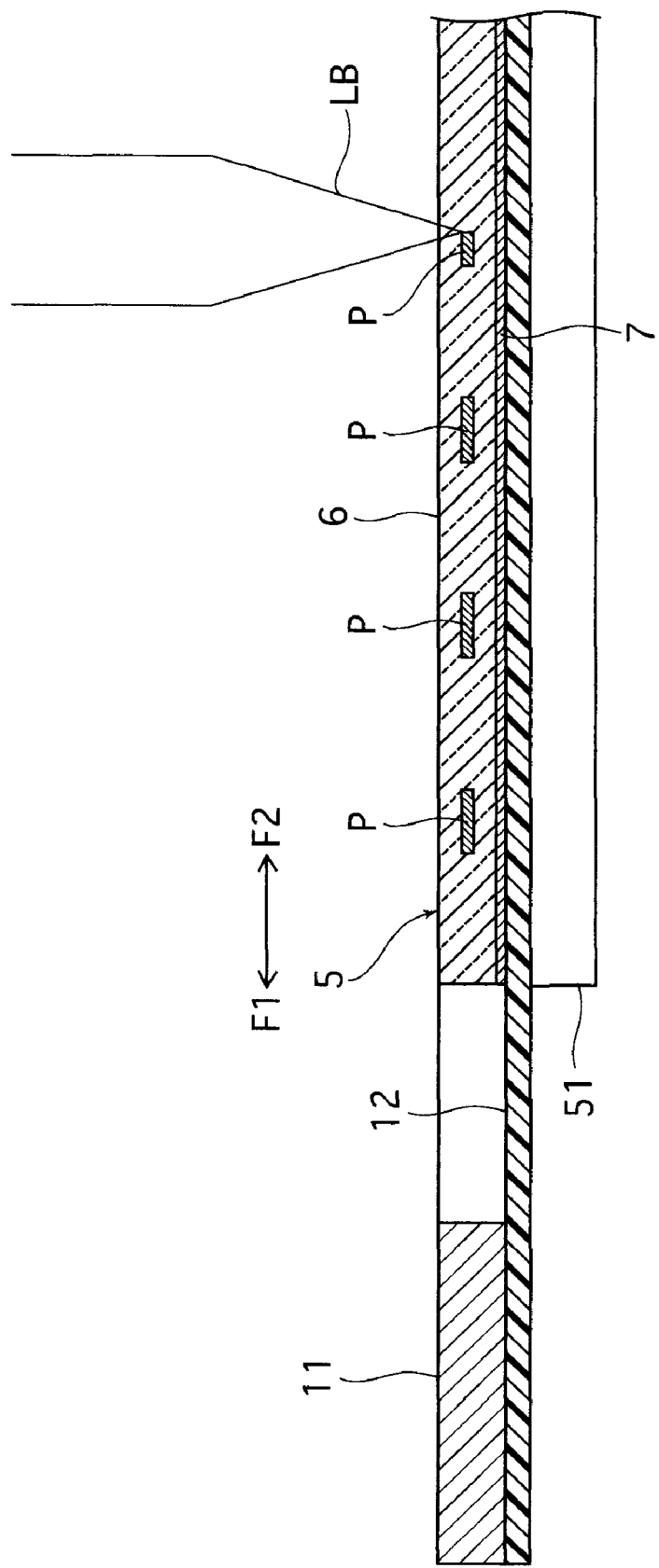

LIGHT EMITTING DEVICE AND MANUFACTURING METHOD THEREOF

BACKGROUND OF THE INVENTION

1. Field of the Invention

The present invention relates to a light emitting device such as a light emitting diode for use in a backlight for a display, an LED indicator, etc. and also relates to a manufacturing method for such a light emitting device.

2. Description of the Related Art

Conventionally provided in a light emitting device such as a light emitting diode (LED) having a sapphire layer and a light emitting layer formed on the sapphire layer (see Japanese Patent Laid-Open No. Hei 10-56203, for example). Such a light emitting device is manufactured by cutting a light emitting device wafer along a plurality of division lines, wherein the light emitting device wafer has a sapphire substrate as a parent substrate and a light emitting layer formed on the front side of the sapphire substrate, and the division lines are formed on the light emitting layer. Thus, the light emitting device wafer is divided along the division lines to obtain a plurality of light emitting devices.

As a method of dividing a substrate such as a sapphire substrate along the division lines, a method including laser processing is known. This method includes the steps of applying a pulsed laser beam to the substrate along the division lines to thereby form a plurality of laser processed grooves on the substrate along the division lines and next applying an external force to these laser processed grooves to thereby break the substrate along the division lines (see Japanese Patent Laid-Open No. Hei 10-305420, for example). Another method of dividing the substrate along the division lines includes the steps of applying a pulsed laser beam having a transmission wavelength to the substrate along the division lines in the condition where the focal point of the pulsed laser beam is set in the substrate to thereby form a plurality of modified layers in the substrate along the division lines in such a manner that each modified layer continuously extends along the corresponding division line and next applying an external force to the division lines where the strength of the substrate is reduced by the formation of the modified layers to thereby break the substrate along the division lines (see Japanese Patent No. 3408805, for example).

SUMMARY OF THE INVENTION

In a light emitting device having a sapphire layer and a light emitting layer formed on the sapphire layer, light emitted from the light emitting layer enters the sapphire layer and then emits from the sapphire layer to the air. The refractive index of sapphire is remarkably large, causing the following problem. When the light emitted from the light emitting layer to the sapphire layer passes through the interface between the sapphire layer and an ambient layer (e.g., air) adjacent to the sapphire layer, the incident angle of the light incident on this interface must be less than a predetermined angle with respect to the normal to the interface (34.5° in the case of the interface between sapphire and air). Accordingly, when the light is incident on the interface at an angle greater than this predetermined angle, the light is totally reflected on the interface and does not emit from the sapphire layer. That is, the totally reflected light is confined in the sapphire layer. Thus, the light emitted from the light emitting layer cannot be efficiently emitted from the sapphire layer.

It is therefore an object of the present invention to provide a light emitting device and a manufacturing method therefore which can efficiently emit the light from the sapphire layer.

In accordance with an aspect of the present invention, there is provided a light emitting device including a sapphire layer; and a light emitting layer formed on the sapphire layer for emitting light into the sapphire layer; the sapphire layer having a back surface opposite to the light emitting layer and a plurality of side surfaces formed between the back surface and the light emitting layer; the back surface having a polygonal shape whose internal angle is an obtuse angle.

Preferably, the shape of the back surface of the sapphire layer is a regular hexagonal shape having an internal angle of 120°. The sapphire layer of the light emitting device according to the present invention is surrounded by the plural side surfaces extending from a plurality of sides of the polygonal back surface to the light emitting layer. Accordingly, although the incident angle of light incident on one side surface of the sapphire layer (the interface between the sapphire layer and an air layer, for example, adjacent to the sapphire layer) is greater than a critical angle for total reflection, the incident angle of the light next incident on another side surface of the sapphire layer or further next incident on still another side surface of the sapphire layer tends to become less than the critical angle. As a result, the quantity of light emitting from the sapphire layer can be increased.

In accordance with another aspect of the present invention, there is provided a light emitting device manufacturing method including a preparing step of preparing a light emitting device wafer having a sapphire substrate and a light emitting layer formed on the front side of the sapphire substrate, the light emitting layer having a plurality of first division lines intermittently extending in a first direction, a plurality of second division lines intermittently extending in a second direction, and a plurality of third division lines intermittently extending in a third direction to thereby partition a plurality of regular hexagonal light emitting device areas arranged like a honeycomb; a holding step of holding the light emitting device wafer by using holding means in the condition where the back side of the sapphire substrate is exposed; a first laser processing step of performing laser processing along the first division lines, the laser processing having the step of applying a laser beam having a transmission wavelength to the sapphire substrate from the back side of the sapphire substrate in the condition where the focal point of the laser beam is set in the sapphire substrate to thereby form a plurality of modified layers in the sapphire substrate; a second laser processing step of performing the laser processing along the second division lines; a third laser processing step of performing the laser processing along the third division lines; and a dividing step of applying an external force to the first division lines, the second division lines, and the third division lines of the light emitting device wafer to thereby break the light emitting device wafer along all of the first, second, and third division lines, thus dividing the light emitting device wafer into a plurality of light emitting devices.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 10 is a sectional view for illustrating the operation of intermittently applying a laser beam along a plurality of division lines to thereby intermittently form a plurality of modified layers in a sapphire substrate of the wafer along these division lines.

DETAILED DESCRIPTION OF THE PREFERRED EMBODIMENTS

A preferred embodiment of the present invention will now be described with reference to the drawings.

(1) Light Emitting Device (1-1) Configuration of Light Emitting Device

Figure 1A:
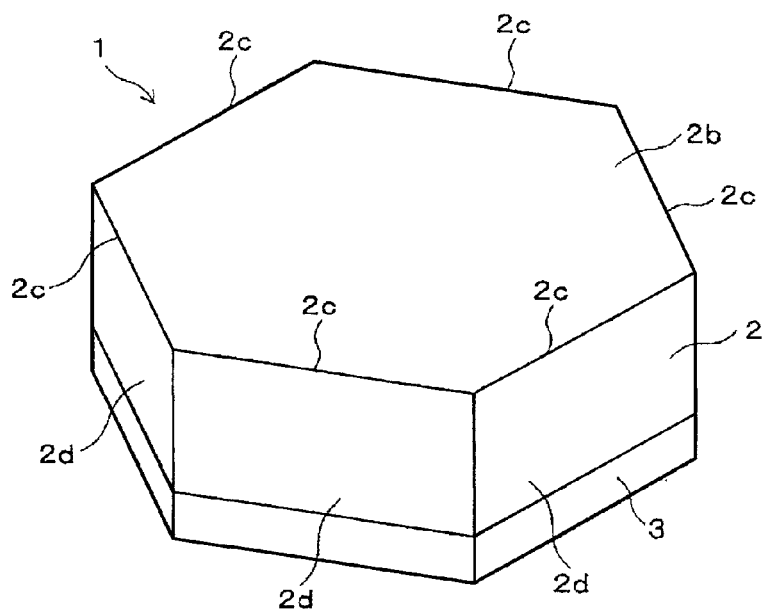
FIG. 1A is a perspective view schematically showing a light emitting device according to a preferred embodiment of the present invention.
Figure 1B:
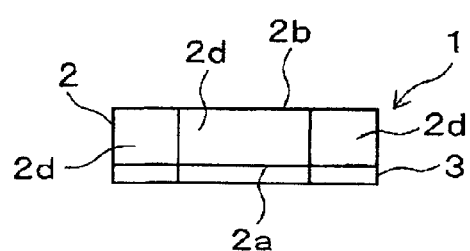
FIG. 1B is a side view of the light emitting device shown in FIG. 1A.
Figure 1C:
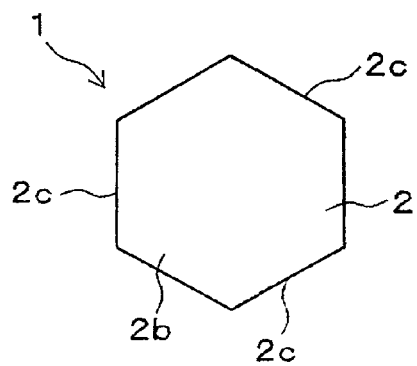
FIG. 1C is a plan view of the light emitting device shown in FIG. 1A.

FIG. 1A is a perspective view of a light emitting device 1 according to a preferred embodiment of the present invention, FIG. 1B is a side view of the light emitting device 1, and FIG. 1C is a plan view of the light emitting device 1. As shown in FIGS. 1A to 1C, the light emitting device 1 is composed of a sapphire layer 2 having a front surface 2a and a back surface 2b and a light emitting layer 3 formed on the front surface 2a of the sapphire layer 2. As shown in FIG. 1C, the light emitting device 1 has a regular hexagonal shape having an internal angle of 120° as viewed in plan in the direction of lamination of the sapphire layer 2 and the light emitting layer 3. That is, the horizontal sectional shape of the sapphire layer 2 is a regular hexagonal shape, and the horizontal sectional shape of the light emitting layer 3 is the same regular hexagonal shape as that of the sapphire layer 2, wherein the light emitting layer 3 such as a GaN semiconductor layer is formed on the front surface 2a of the sapphire layer 2.

In other words, the front surface 2a and the back surface 2b of the sapphire layer 2 have regular hexagonal shapes of the same size, and six rectangular side surfaces 2d (2d-1 to 2d-6 shown in FIG. 2) are respectively formed between the front surface 2a and the back surface 2b so as to extend from the six sides 2c of the regular hexagonal back surface 2b to the light emitting layer 3. According to the light emitting device 1 of the present invention, due to light luminance by the light emitting layer 3, light emitted from the light emitting layer 3 is transmitted through the sapphire layer 2 and then emits from the back surface 2b and each side surface 2d to the outside of the sapphire layer 2 (e.g., to the ambient air).

The light emitting layer 3 is of such a kind as well known in the art, and it is configured of a bandgap layer or a quantum well, for example. However, the configuration of the light emitting layer 3 is not limited. The light emitting layer 3 is formed of any compound containing the elements of the group III-V or the group II-VI. Examples of such a compound include indium gallium nitride (InGaN), gallium nitride (GaN), gallium arsenide (GaAs), gallium indium nitride (GaInN), aluminum gallium nitride (AlGaN), zinc selenide (ZeSe), zinc doped indium gallium nitride (InGaN:Zn), aluminum indium gallium phosphide (AlInGaP), and gallium phosphide (GaP). The light emitting layer 3 is formed by a light emitting device containing any of these compounds. Examples of such a light emitting device include a light emitting diode and an EL (Electro Luminescence) device.

(1-2) Operation and Effect of Light Emitting Device

Figure 2:
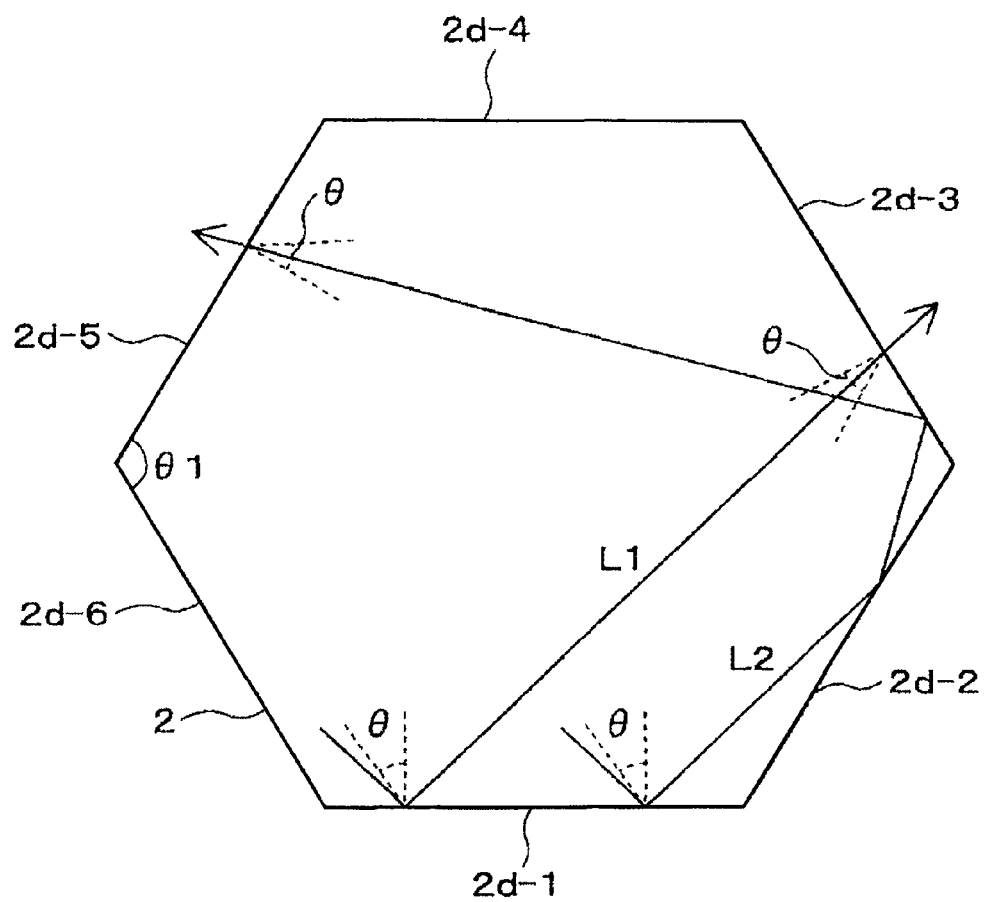
FIG. 2 is a sectional view schematically showing a manner of transmission of light in a sapphire layer of the light emitting device shown in FIGS. 1A to 1C.
Figure 3:
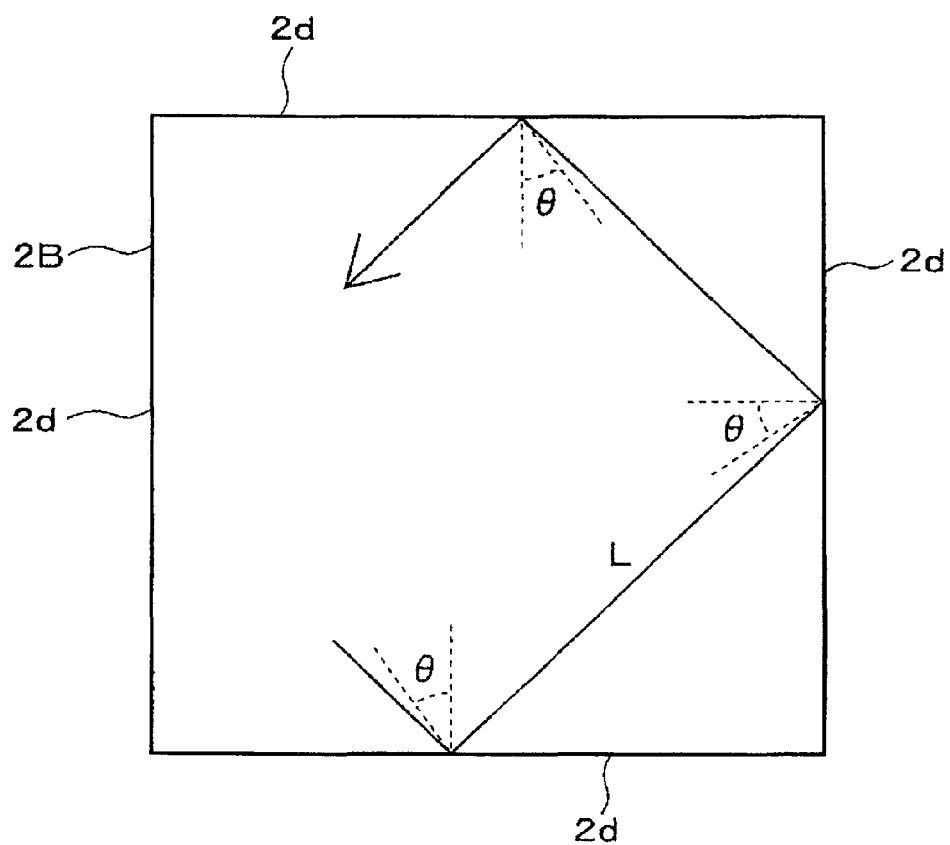
FIG. 3 is a sectional view schematically showing a manner of total reflection on the side surfaces of a sapphire layer of a light emitting device in the prior art.

As shown in FIG. 2, the horizontal sectional shape of the sapphire layer 2 in this preferred embodiment is a regular hexagonal shape having an internal angle θ1 of 120°, so that the quantity of light emerging from the sapphire layer 2 can be increased. The reason for this effect will now be described. FIG. 3 shows a sapphire layer 2B whose horizontal sectional shape (the shape of its back surface) is square. In the case that light L in the sapphire layer 2B is incident on a side surface 2d, the critical angle θ allowing the light L to pass through the side surface 2d, e.g., to pass through the interface between the sapphire layer 2B and the air and emit to the air, is a relatively small angle of about 34.5° according to the refractive indices of the sapphire layer 2B and the air. When the light L is incident on the side surface 2d at an incident angle less than or equal to this critical angle θ, the light L is allowed to pass through the side surface 2d. However, when the light L is incident on the side surface 2d at an incident angle greater than the critical angle θ, the light L is totally reflected on the side surface 2d. Thereafter, the total reflection is repeated on the other side surfaces 2d to finally disappear in the sapphire layer 2B.

In contrast, the sapphire layer 2 shown in FIG. 2 according to this preferred embodiment has a regular hexagonal sectional shape, so that light L1 incident on one side surface 2d-1 at an incident angle greater than the critical angle &H is totally reflected on the side surface 2d-1 and next enters another side surface 2d-3 at an incident angle less than the critical angle θ to pass through the side surface 2d-3. Further, light L2 incident on the side surface 2d-1 at an incident angle greater than the critical angle θ at a different position is also totally reflected on the side surface 2d-1 and next enters another side surface 2d-2 adjacent to the side surface 2d-1 to totally reflect on the side surface 2d-2. The light L2 totally reflected on the side surface 2d-2 next enters the side surface 2d-3 adjacent to the side surface 2d-2 at an incident angle greater than the critical angle θ to totally reflect on the side surface 2d-3. The light L2 totally reflected on the side surface 2d-3 next enters another side surface 2d-5 at an incident angle less than the critical angle θ to pass through the side surface 2d-5.

Figure 4:
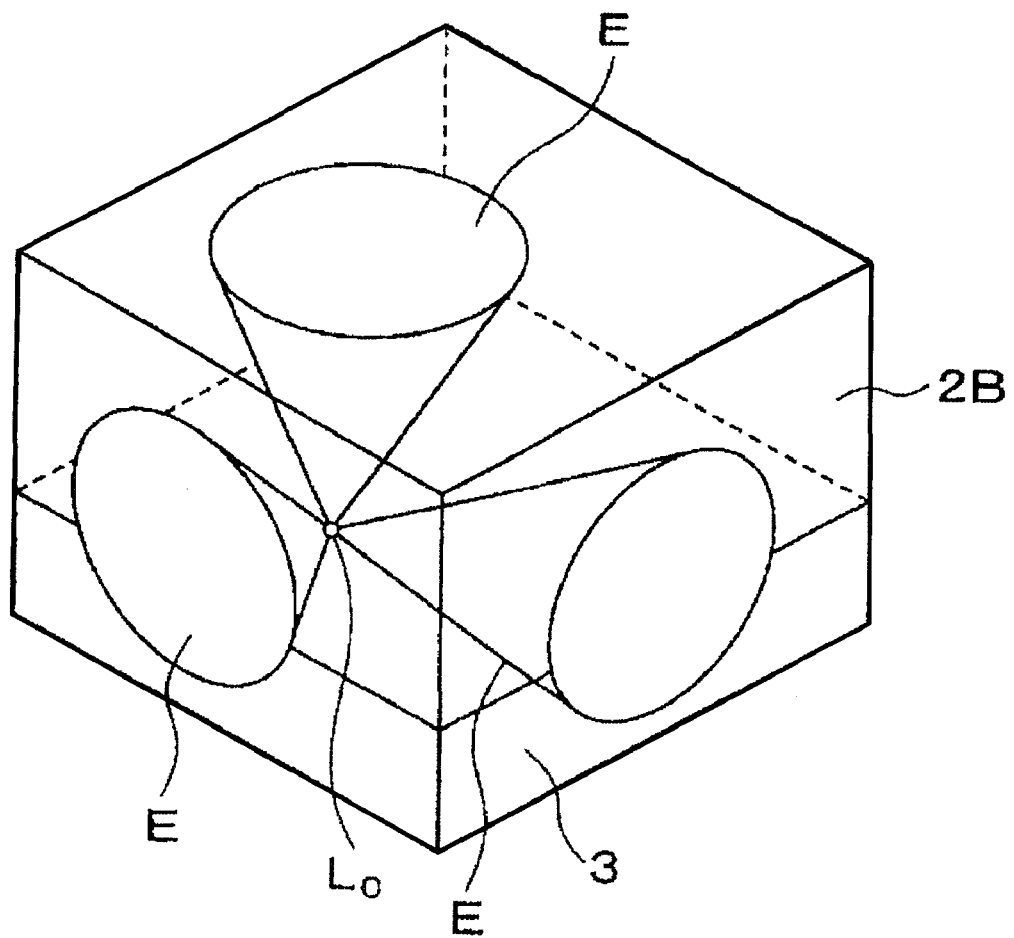
FIG. 4 is a perspective view of the light emitting device shown in FIG. 3, illustrating an escape cone.

As described above, according to the light emitting device 1 in this preferred embodiment, although the incident angle of light incident on one side surface 2d in the sapphire layer 2 is greater than the critical angle θ to cause the total reflection on this side surface 2d, the incident angle of the totally reflected light next incident on another side surface 2d or further next incident on another side surface 2d tends to become less than the critical angle θ. Accordingly, the preservation of the total reflection in the sapphire layer 2 can be reduced. As a result, the quantity of light emerging from the sapphire layer 2 can be increased and the light L can efficiently emit from the sapphire layer 2. In other words, as shown in FIG. 4 (FIG. 4 shows a light emitting device having a rectangular shape as shown in FIG. 3), light emitted from a certain light emitting point L0 is required to travel in an area generally called an escape cone E and then emit from the sapphire layer 2B. This escape cone E shows an area where the light emitted from the light emitting point L0 can pass through the interface between the sapphire layer 2B and the layer adjacent to the sapphire layer 2B. According to the present invention, the sectional shape of the sapphire layer is a polygonal shape whose internal angle is an obtuse angle, so that it is considered that the escape cone E can be enlarged.

Figure 5A:
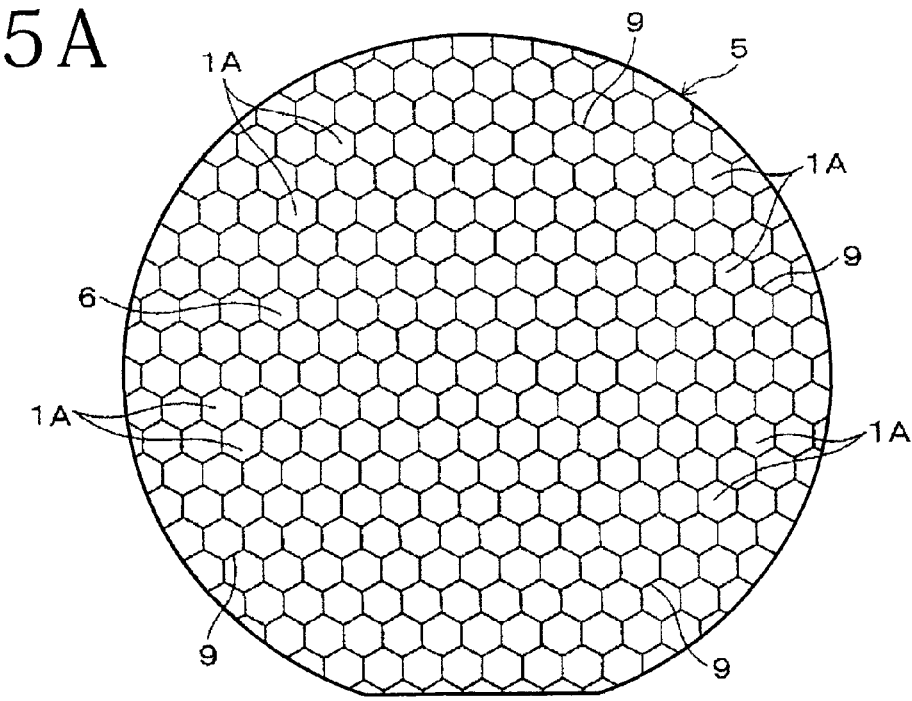
FIG. 5A is a plan view of a light emitting device wafer including a plurality of light emitting device areas each having a regular hexagonal shape.
Figure 5B:
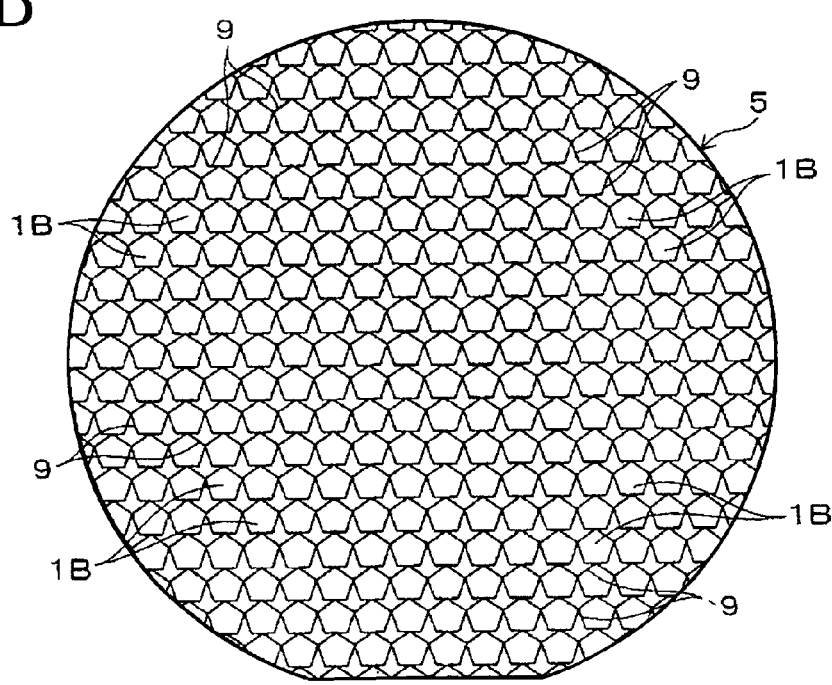
FIG. 5B is a plan view of a light emitting device wafer including a plurality of light emitting device areas each having a regular pentagonal shape.

The light emitting device 1 is obtained by dividing a light emitting device wafer having a sapphire substrate as a parent substrate and a light emitting layer formed on the front side of the sapphire substrate, wherein the sapphire substrate is divided into a plurality of sapphire layers 2 and the light emitting layer is divided into a plurality of light emitting layers 3. More specifically, FIG. 5A shows a light emitting device wafer 5 having a plurality of light emitting device areas 1A each corresponding to the light emitting device 1 having a regular hexagonal shape as viewed in plan. These light emitting device areas 1A are partitioned by a plurality of division lines 9 forming a plurality of regular hexagonal shapes. The light emitting device areas 1A are divided along these division lines 9 to obtain the individual light emitting devices 1. The shape of the light emitting device according to the present invention is not limited to a regular hexagonal shape, but a polygonal shape having an obtuse internal angle such as a regular pentagonal shape and a regular octagonal shape may be included. For example, FIG. 5B shows another light emitting device wafer 5 having a plurality of light emitting device areas 1B each having a regular pentagonal shape as viewed in plan, wherein these light emitting device areas 1B are partitioned by a plurality of division lines 9 forming a plurality of regular pentagonal shapes. The light emitting device areas 1B are divided along these division lines 9 to obtain a plurality of individual light emitting devices each having a regular pentagonal shape as viewed in plan.

(2) Light Emitting Device Manufacturing Method and Laser Processing Apparatus

There will now be described a light emitting device manufacturing method and a laser processing apparatus for use in manufacturing the light emitting device 1 having a regular hexagonal shape shown in FIGS. 1A to 1C. This manufacturing method is a method of manufacturing a plurality of light emitting devices 1 from the light emitting device wafer 5 shown in FIG. 5A.

(2-1) Light Emitting Device Wafer

Figure 6:
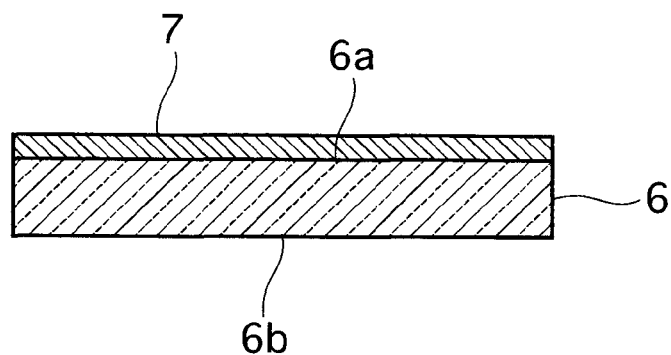
FIG. 6 is a sectional view of the light emitting device wafer shown in FIG. 5A.
Figure 7:
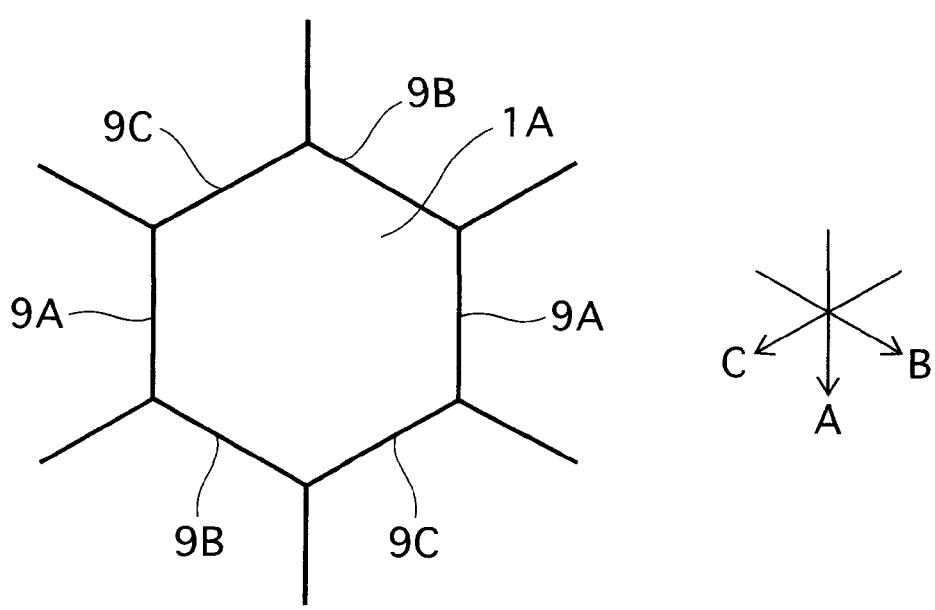
FIG. 7 is an enlarged plan view showing one of the light emitting device areas of the light emitting device wafer shown in FIG. 5A.

As shown in FIG. 6, the light emitting device wafer 5 is composed of a disk-shaped sapphire substrate 6 having a front surface (one surface) 6a and a back surface 6b and a light emitting layer 7 formed on the whole front surface 6a of the sapphire substrate 6. As shown in FIG. 5A, the light emitting device wafer 5 has the plural light emitting device areas 1A each having a regular hexagonal shape and corresponding to the light emitting device 1, wherein these light emitting device areas 1A are arranged like a honeycomb. As shown in FIG. 7, each light emitting device area 1A is a regular hexagonal area surrounded by a pair of first division lines 9A extending in a first direction shown by an arrow A, a pair of second division lines 9B extending in a second direction shown by an arrow B, and a pair of third division lines 9C extending in a third direction shown by an arrow C. Accordingly, the light emitting device wafer 5 has a plurality of first division lines 9A arranged linearly and intermittently in the first direction, a plurality of second division lines 9B arranged linearly and intermittently in the second direction, and a plurality of third division lines 9C arranged linearly and intermittently in the third direction. Each light emitting device area 1A is formed between the opposite ends of the adjacent division lines 9A (9B, 9C) extending in one line.

Figure 8:
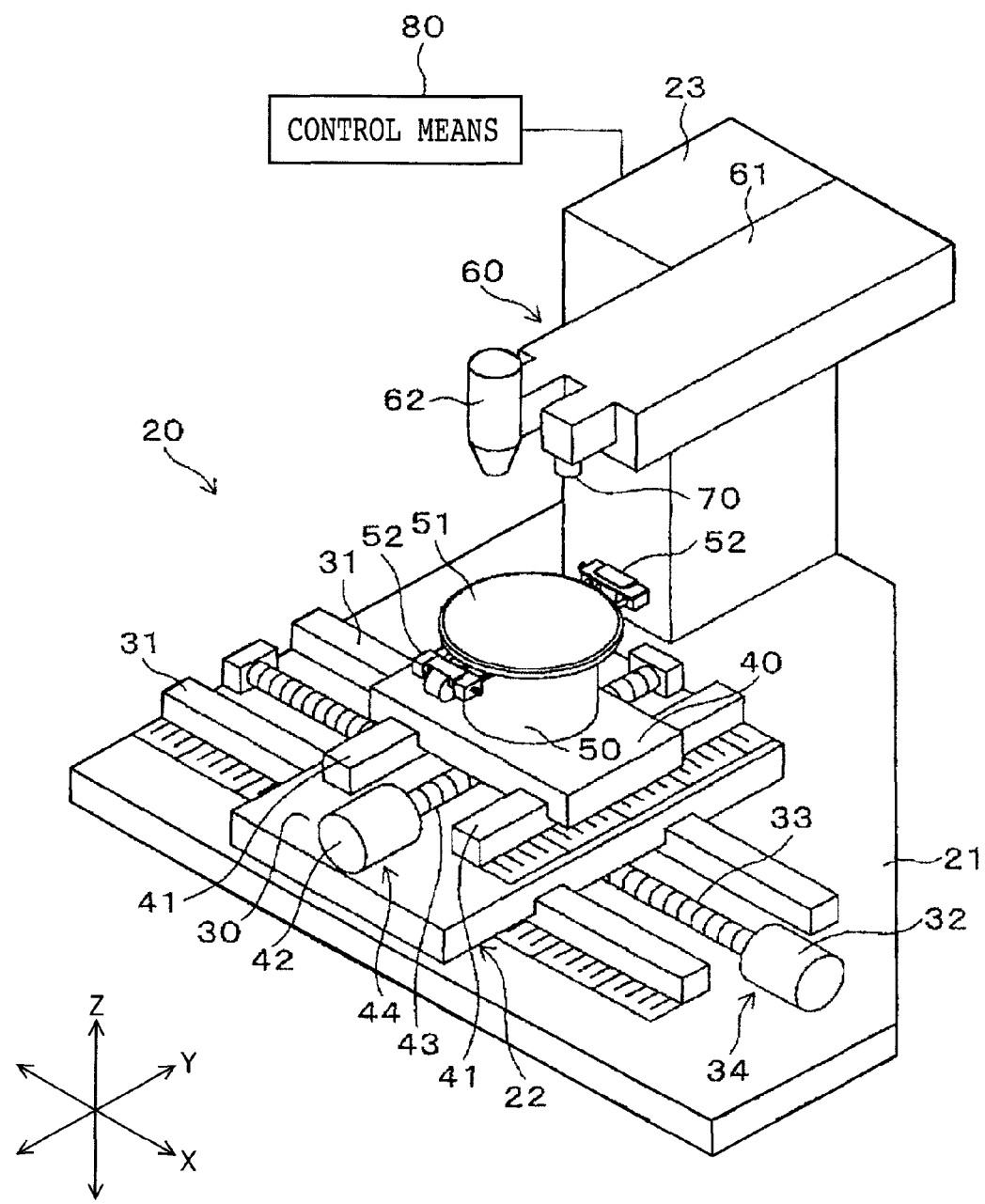
FIG. 8 is a perspective view of a laser processing apparatus used in performing a light emitting device manufacturing method according to a preferred embodiment of the present invention.

A manufacturing method for obtaining the plural light emitting devices 1 from the light emitting device wafer 5 is performed by using a laser processing apparatus 20 shown in FIG. 8. According to this manufacturing method, a pulsed laser beam having a transmission wavelength to sapphire is applied to the light emitting device wafer 5 along the division lines 9A, 9B, and 9C in the condition where the focal point of the pulsed laser beam is set in the sapphire substrate 6, thereby forming a plurality of modified layers in the sapphire substrate 6 along the division lines 9A, 9B, and 9C. Thereafter, an external force is applied to the division lines 9A, 9B, and 9C where the strength of the sapphire substrate 6 is reduced by the formation of the modified layers, thereby breaking the sapphire substrate 6 along the division lines 9A, 9B, and 9C. Thus, the light emitting device wafer 5 is divided into the plural light emitting devices 1. For example, the formation of the modified layers may be performed by focusing femtosecond laser having a wavelength of 1064 nm with a lens having an NA of 0.8 or more to form a laser beam capable of producing multiphoton absorption. Each modified layer mentioned above means a region different from its ambient region in density, refractive index, mechanical strength, or any other physical properties. Examples of each modified layer include a melted region, cracked region, breakdown region, and refractive index changed region and the like. These regions may be included separately or in a mixed condition.

Figure 9:
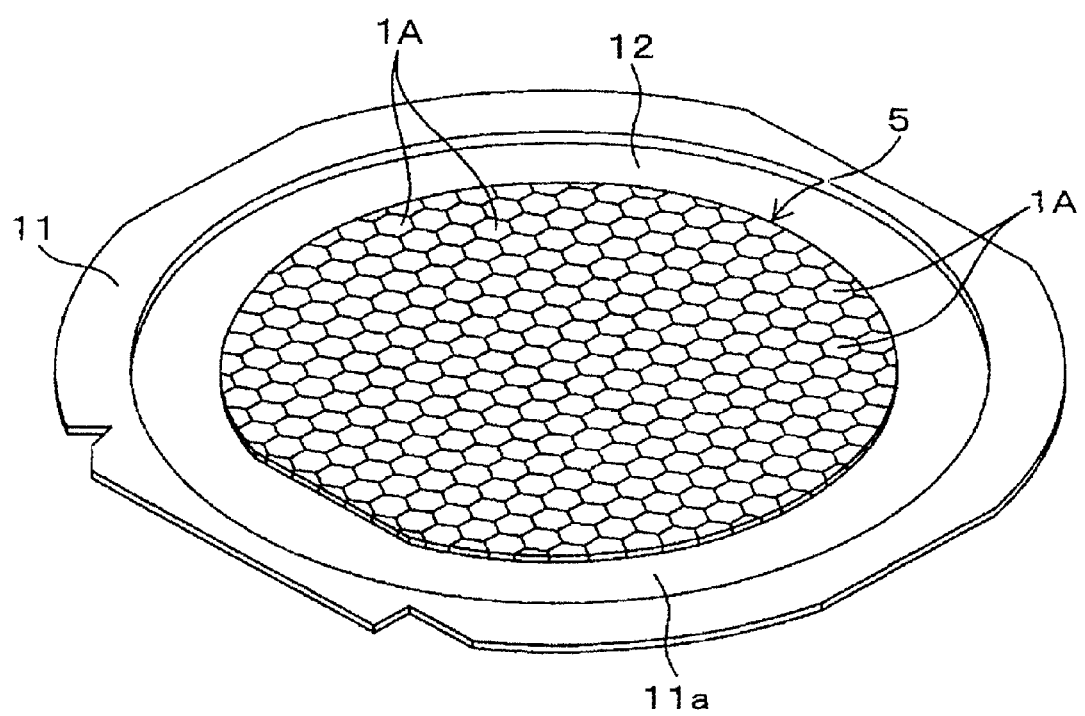
FIG. 9 is a perspective view of the light emitting device wafer supported through an adhesive tape to an annular frame in supplying the wafer to the laser processing apparatus shown in FIG. 8.

The light emitting device wafer 5 is supplied to the laser processing apparatus 20 in the condition where it is supported through an adhesive tape 12 to an annular frame 11 in its inner opening 11a as shown in FIG. 9. The frame 11 is formed from a rigid metal plate such as a stainless steel plate. The adhesive tape 12 is composed of a base sheet such as a synthetic resin sheet and an adhesive layer formed on one side of the base sheet. The adhesive layer of the adhesive tape 12 is attached to the back side (lower side) of the frame 11 so as to close the inner opening 11a of the frame 11. The light emitting device wafer 5 is concentrically located in the inner opening 11a of the frame 11, and the light emitting layer 7 of the light emitting device wafer 5 is attached to the adhesive layer of the adhesive tape 12. The light emitting device wafer 5 is transported by handling the frame 11.

(2-2) Configuration of Laser Processing Apparatus

The laser processing apparatus 20 for applying a laser beam to the light emitting device wafer 5 will now be described with reference to FIG. 8. Reference numeral 21 denotes a base of the laser processing apparatus 20. An XY moving table 22 is provided on the base 21 so as to be movable both in the X direction and in the Y direction in a horizontal plane. A chuck table (holding means, laser beam scanning means) 51 for holding the light emitting device wafer 5 is provided on the XY moving table 22. A laser beam applying portion 62 of laser beam applying means 60 for applying a laser beam toward the light emitting device wafer 5 held on the chuck table 51 is provided above the chuck table 51 so as to face the chuck table 51.

The XY moving table 22 is configured by combining an X-axis base 30 provided on the base 21 so as to be movable in the X direction and a Y-axis base 40 provided on the X-axis base 30 so as to be movable in the Y direction. A pair of parallel guide rails 31 extending in the X direction are fixed on the base 21, and the X-axis base 30 is slidably mounted on the guide rails 31. The X-axis base 30 is movable in the X direction by an X-axis driving mechanism 34 including a motor 32 and a ball screw 33 adapted to be rotated by the motor 32. Similarly, a pair of parallel guide rails 41 extending in the Y direction are fixed on the X-axis base 30, and the Y-axis base 40 is slidably mounted on the guide rails 41. The Y-axis base 40 is movable in the Y direction by a Y-axis driving mechanism 44 including a motor 42 and a ball screw 43 adapted to be rotated by the motor 42.

A cylindrical chuck base 50 is fixed to the upper surface of the Y-axis base 40. The chuck table 51 is supported on the chuck base 50 so as to be rotatable about an axis extending in the Z direction (vertical direction). The chuck table 51 is of a vacuum chuck type well known in the art such that the light emitting device wafer 5 is held on the chuck table 51 under suction by using a vacuum produced by suction means (not shown). The chuck table 51 is rotatable in one direction or in opposite directions by rotationally driving means (not shown) contained in the chuck base 50. A pair of clamps 52 for detachably holding the frame 11 supporting the light emitting device wafer 5 are provided near the outer circumference of the chuck table 51 so as to be spaced 180° apart from each other. These clamps 52 are mounted on the chuck base 50.

In moving the X-axis base 30 of the XY moving table 22 in the X direction, a laser beam is applied along the division lines 9A, 9B, and 9C, i.e., a feeding operation is performed. In moving the Y-axis base 40 of the XY moving table 22 in the Y direction, a target division line group subjected to the laser processing is changed to another target division line group, i.e., an indexing operation is performed. Thus, the operational direction of the feeding operation is set to the X direction, and the operational direction of the indexing operation is set to the Y direction in this preferred embodiment. As a modification, the feeding direction may be set to the Y direction, and the indexing direction may be set to the X direction.

The laser beam applying means 60 will now be described. The laser beam applying means 60 has a boxlike casing 61 extending in the Y direction to a position above the chuck table 51. The laser beam applying portion 62 is provided at the front end of the casing 61. A column 23 stands on the base 21, and the casing 61 is provided on the column 23 so as to be movable in the vertical direction (the Z direction) by vertically driving means (not shown) contained in the column 23.

The casing 61 contains pulsed laser beam oscillating unit and laser beam power adjusting unit for adjusting the power (pulse energy) of a laser beam oscillated by the pulsed laser beam oscillating unit. The pulsed laser beam oscillating unit and the laser beam power adjusting unit constitute the laser beam applying means 60. The laser beam applying portion (focusing unit) 62 is designed to downwardly apply a pulsed laser beam having a transmission wavelength to the sapphire substrate 6. The laser beam applying portion 62 includes a mirror for changing the traveling direction of the laser beam oscillated from the pulsed laser beam oscillating unit to a downward direction and a lens for focusing the laser beam reflected by this mirror.

Imaging means 70 is provided at the front end of the casing 61 of the laser beam applying means 60 at a position near the laser beam applying portion 62. The imaging means 70 functions to detect a laser beam applying area in the light emitting device wafer 5 to be irradiated with the laser beam applied by the laser beam applying portion 62. The imaging means 70 includes illuminating means for illuminating the light emitting device wafer 5 held on the chuck table 51, an optical system for capturing light from the illuminating means, and an imaging device such as a CCD for outputting an electrical signal corresponding to the light captured by the optical system. The imaging means 70 further includes an infrared CCD. Image information obtained by the imaging means 70 is supplied to control means 80. The control means 80 functions to suitably control various operations including the rotation of the chuck table 51, the movement (feeding operation) of the X-axis base 30 by the X-axis driving mechanism 34, the movement (indexing operation) of the Y-axis base 40 by the Y-axis driving mechanism 44, and the application of the laser beam by the laser beam applying means 60 according to the image information supplied from the imaging means 70.

(2-3) Operation of Laser Processing Apparatus

There will now be described the operation of laser-processing the sapphire substrate 6 of the light emitting device wafer 5 by using the laser processing apparatus 20. This operation is automatically controlled by the control means 80, and includes the manufacturing method of the present invention. The laser processing in this preferred embodiment includes the step of applying a pulsed laser beam having a transmission wavelength to the sapphire substrate 6 along the first, second, and third division lines 9A, 9B, and 9C in the condition where the focal point of the pulsed laser beam is set in the sapphire substrate 6, thereby forming a plurality of modified layers along the first, second, and third division lines 9A, 9B, and 9C in the sapphire substrate 6. In this preferred embodiment, the laser processing is performed stepwise on the order of the first division lines 9A, the second division lines 9B, and the third division lines 9C.

(2-3-1) Holding Step for Light Emitting Device Wafer

The suction means connected to the chuck table 51 is operated to produce a vacuum on the upper surface of the chuck table 51, and the light emitting device wafer 5 supported through the adhesive tape 12 to the frame 11 as shown in FIG. 9 is placed on the chuck table 51 in the condition where the sapphire substrate 6 is oriented upward. Accordingly, as shown in FIG. 10, the light emitting layer 7 of the light emitting device wafer 5 is held under suction on the upper surface of the chuck table 51 through the adhesive tape 12. Further, the frame 11 is fixed by the clamps 52.

Thereafter, the XY moving table 22 is suitably moved in the X direction and the Y direction to thereby move the wafer 5 to a position directly below the imaging means 70. At this position, the imaging means 70 images the first to third division lines 9A to 9C formed on the light emitting layer 7 through the sapphire substrate 6. Thereafter, the control means 80 performs an alignment operation according to the image information on the first to third division lines 9A to 9C. That is, the chuck table 51 is rotated to make the first division lines 9A parallel to the feeding direction (X direction).

(2-3-2) First Laser Processing Step

The X-axis base 30 is moved in the X direction to move the light emitting device wafer 5 to a standby position deviated from the laser beam applying portion 62 in the X direction. Further, the Y-axis base 40 is moved in the indexing direction (Y direction) to make the position of the Y direction of a predetermined one of the first division lines 9A coincide with the focal point of the laser beam to be applied from the laser beam applying portion 62. Further, the casing 61 is moved in the vertical direction (Z direction) to set the focal point of the laser beam to be applied from the laser beam applying portion 62 to a predetermined depth in the sapphire substrate 6.

Thereafter, the X-axis base 30 is moved in the feeding direction to thereby locate the above predetermined first division line 9A to a position directly below the laser beam applying portion 62, and the laser beam is applied from the laser beam applying portion 62 toward the sapphire substrate 6. Thus, the ON/OFF operation of the laser beam is repeated to thereby intermittently apply the laser beam along only the indexed first division lines 9A intermittently extending in the X direction. As shown in FIG. 10, the laser beam LB is applied to the sapphire substrate 6 along the indexed first division lines 9A to thereby form a plurality of modified layers P along the indexed first division lines 9A in the sapphire substrate 6, wherein the strength of the sapphire substrate 6 is reduced by the formation of the modified layers P. In FIG. 10, an arrow F1 indicates the direction of movement of the chuck table 51, and an arrow F2 indicates the direction of scanning of the laser beam LB.

Thereafter, the Y-axis base 40 is moved in the indexing direction to make the Y position of the next first division lines 9A adjacent to the previous laser-processing first division lines 9A coincide with the focal point of the laser beam. Thereafter, the light emitting device wafer 5 is moved in the feeding direction, and the ON/OFF operation of the laser beam is repeated similarly to thereby apply the laser beam along only the indexed first division lines 9A intermittently extending in the X direction.

Figure 11A:
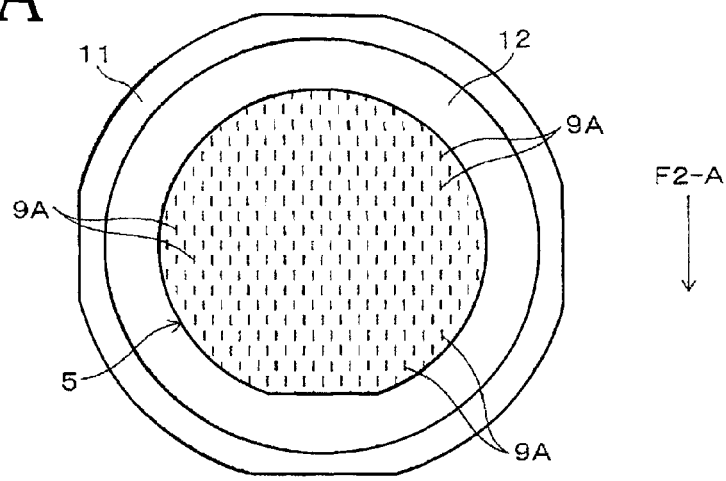
FIGS. 11A to 11C are plan views for illustrating the sequential steps of applying the laser beam along the plural division lines extending in three different directions on a light emitting layer of the wafer to thereby form the modified layers.

In this manner, the feeding operation for intermittently applying the laser beam to the indexed first division lines 9A to thereby intermittently form the modified layers P and the indexing operation for determining the laser beam applying position in the Y direction are alternately repeated to thereby scan the laser beam along all of the first division lines 9A as shown in FIG. 11A, thus forming a plurality of intermittent modified layers P in the sapphire substrate 6 along all of the first division lines 9A. In FIG. 11A, an arrow F2-A indicates the direction of scanning of the laser beam in the first laser processing step.

(2-3-3) Second Laser Processing Step

Figure 11B:
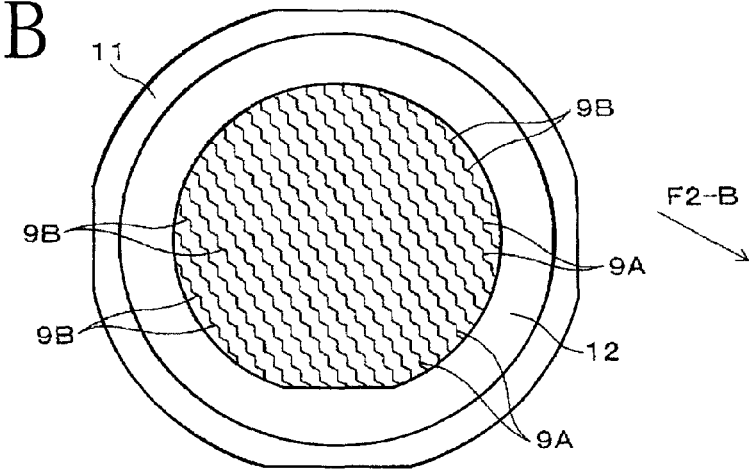

After forming the modified layers P along all of the first division lines 9A, a second laser processing step of applying the laser beam along the second division lines 9B is performed in the following manner. First, the chuck table 51 is rotated 60° in one direction to make the second division lines 9B parallel to the X direction. Thereafter, the chuck table 51 is moved in the X direction to feed the wafer 5, and the laser beam is intermittently applied to the wafer 5. Thereafter, the chuck table 51 is moved in the Y direction to index the wafer 5. As in the first laser processing step mentioned above, the feeding operation and the indexing operation mentioned above are alternately repeated to thereby scan the laser beam along all of the second division lines 9B as shown in FIG. 11B (in the direction shown by an arrow F2-B), thus forming a plurality of intermittent modified layers P in the sapphire substrate 6 along all of the second division lines 9B.

(2-3-4) Third Laser Processing Step

Figure 11C:
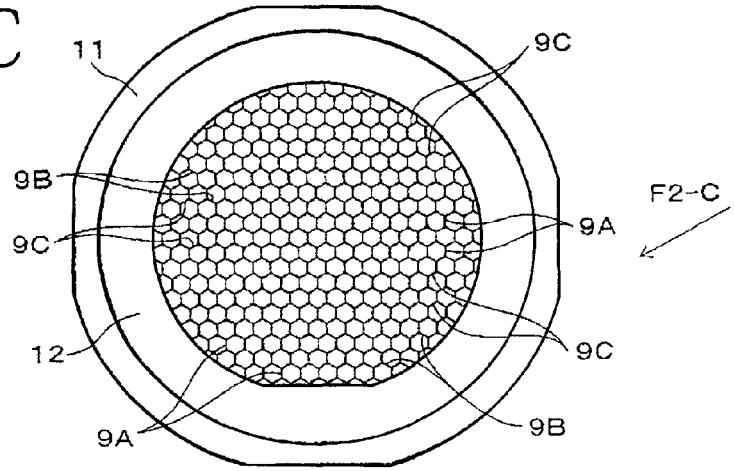

After performing the second laser processing step mentioned above, a third laser processing step of applying the laser beam along the third division lines 9C is carried out. First, the chuck table 51 is further rotated 60° in the above one direction to make the third division lines 9C parallel to the X direction. Thereafter, the feeding operation and the indexing operation are alternately repeated as in the second laser processing step to thereby scan the laser beam along all of the third division lines 9C as shown in FIG. 11C (in the direction shown by an arrow F2-C), thus forming a plurality of intermittent modified layers P in the sapphire substrate 6 along all of the third division lines 9C.

(2-3-5) Dividing Step

By performing the first, second, and third laser processing steps as mentioned above, the modified layers P are formed along the first, second, and third division lines 9A, 9B, and 9C, so that each regular hexagonal light emitting device area 1A of the sapphire substrate 6 is surrounded by the modified layers P forming a regular hexagonal shape as viewed in plan. Thereafter, an external force is applied to all of the division lines 9A to 9C where the modified layers P are formed, thereby breaking the light emitting device wafer 5 along all of the division lines 9A to 9C. As a result, each light emitting device area 1A becomes the light emitting device 1. That is, the light emitting device wafer 5 is divided into the individual light emitting devices 1 each shown in FIGS. 1A to 1C. As a method of applying an external force to the division lines 9A to 9C, a method of radially outward expanding the adhesive tape 12 is preferably adopted. This method may be performed by using an expanding apparatus disclosed in Japanese Patent Laid-Open Nos. 2007-27250 and 2008-140874, for example.

(2-4) Superiority of the Manufacturing Method

The method of obtaining the plural light emitting devices 1 each having a regular hexagonal shape from the light emitting device wafer 5 by using the laser processing apparatus 20 has the following superiority. The operation of applying the laser beam along the first to third division lines 9A to 9C to thereby form the modified layers P in the sapphire substrate 6 is divided into the first, second, and third laser processing steps respectively for the first, second, and third division lines 9A, 9B, and 9C. Accordingly, in each laser processing step, the laser beam can be scanned linearly and intermittently without rotating the chuck table 51. Accordingly, it is not necessary to provide a mechanism for scanning the laser beam in a zigzag form, for example. Further, it is not necessary to perform an operation of complexly moving the XY moving table 22 in the X direction and the Y direction. That is, with a simple operation by the combination of the movement of the chuck table 51 in the X direction and the ON/OFF operation of the laser beam, the modified layers P can be reliably formed along all of the first to third division lines 9A to 9C surrounding all of the light emitting device areas 1A each having a regular hexagonal shape.

In the case that the laser beam has a transmission wavelength to sapphire and cannot produce multiphoton absorption, there is a possibility that the laser beam is transmitted through the sapphire substrate and the sapphire substrate cannot be laser-processed. In this case, the ON/OFF operation of the laser beam from the back side of the sapphire substrate is not suitable for the formation of the intermittent modified layers. In contrast, the laser processing according to the present invention is performed owing to multiphoton absorption. Accordingly, although the laser beam has a transmission wavelength to the sapphire substrate, the intermittent modified layers P as weak portions can be reliably formed in the sapphire substrate.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A light emitting device manufacturing method comprising:
- a preparing step of preparing a light emitting device wafer having a sapphire substrate and a light emitting layer formed on the front side of said sapphire substrate, said light emitting layer having a plurality of first division lines intermittently extending in a first direction, a plurality of second division lines intermittently extending in a second direction, and a plurality of third division lines intermittently extending in a third direction to thereby partition a plurality of regular hexagonal light emitting device areas arranged like a honeycomb;
- a holding step of holding said light emitting device wafer by using holding means in the condition where the back side of said sapphire substrate is exposed;
- a first laser processing step of performing laser processing along said first division lines, said laser processing having the step of applying a laser beam having a transmission wavelength to said sapphire substrate from the back side of said sapphire substrate in the condition where the focal point of said laser beam is set in said sapphire substrate to thereby form a plurality of modified layers in said sapphire substrate;
- a second laser processing step of performing said laser processing along said second division lines;
- a third laser processing step of performing said laser processing along said third division lines; and
- a dividing step of applying an external force to said first division lines, said second division lines, and said third division lines of said light emitting device wafer to thereby break said light emitting device wafer along all of said first, second, and third division lines, thus dividing said light emitting device wafer into a plurality of light emitting devices.

* * * * *